United States Patent
Li et al.

(10) Patent No.: US 10,983,242 B2
(45) Date of Patent: Apr. 20, 2021

(54) NUCLEAR MAGNETIC RESONANCE SENSING AND FLUID SAMPLING DEVICE FOR SUBTERRANEAN CHARACTERIZATION

(71) Applicant: Halliburton Energy Services, Inc., Houston, TX (US)

(72) Inventors: Lilong Li, Humble, TX (US); Songhua Chen, Katy, TX (US); Arcady Reiderman, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 341 days.

(21) Appl. No.: 15/736,588

(22) PCT Filed: Aug. 8, 2016

(86) PCT No.: PCT/US2016/046076
§ 371 (c)(1),
(2) Date: Dec. 14, 2017

(87) PCT Pub. No.: WO2018/030993
PCT Pub. Date: Feb. 15, 2018

(65) Prior Publication Data
US 2018/0356552 A1    Dec. 13, 2018

(51) Int. Cl.
*G01V 3/32* (2006.01)
*G01N 24/08* (2006.01)
(Continued)

(52) U.S. Cl.
CPC .............. *G01V 3/32* (2013.01); *E21B 49/08* (2013.01); *E21B 49/082* (2013.01);
(Continued)

(58) Field of Classification Search
CPC ......... G01V 3/32; E21B 49/08; E21B 49/082; G01N 24/081; G01N 24/082; G01R 33/307; G01R 33/3808; G01R 33/383
See application file for complete search history.

(56) References Cited

U.S. PATENT DOCUMENTS

| | | |
|---|---|---|
| 6,111,408 A | 8/2000 | Blades |
| 6,720,765 B2 | 4/2004 | Edwards et al. |

(Continued)

FOREIGN PATENT DOCUMENTS

| | | |
|---|---|---|
| WO | WO2003040743 A1 | 5/2003 |
| WO | 2004099817 A2 | 11/2004 |

(Continued)

OTHER PUBLICATIONS

PCT International Search Report and Written Opinion dated May 1, 2017, issued in corresponding application No. PCT/US2016/046076 filed on Aug. 8, 2016, 16 pgs.

*Primary Examiner* — Robert J Eom
(74) *Attorney, Agent, or Firm* — Chamberlain Hrdlicka (57) ABSTRACT

A subterranean characterization and fluid sampling device for analyzing a fluid from a subterranean formation includes a controller, a tool body, and a probing module. The tool body includes a fluid testing module configured to receive a sample of the fluid from the subterranean formation and a permanent magnet configured to induce a static magnetic field (B0). The probing module is coupled to the tool body and separate from the permanent magnet, and configured to withdraw the fluid from the formation and deliver the fluid to the testing module. The probing module comprises an antenna that generates a radio frequency magnetic field (B1) in response to a signal from the controller.

6 Claims, 5 Drawing Sheets

(51) Int. Cl.
  *G01R 33/30* (2006.01)
  *G01R 33/38* (2006.01)
  *G01R 33/383* (2006.01)
  *E21B 49/08* (2006.01)

(52) U.S. Cl.
  CPC ......... *G01N 24/081* (2013.01); *G01N 24/082* (2013.01); *G01R 33/307* (2013.01); *G01R 33/383* (2013.01); *G01R 33/3808* (2013.01); *E21B 49/0875* (2020.05)

(56) References Cited

U.S. PATENT DOCUMENTS

| | | |
|---|---|---|
| 7,180,288 B2 | 2/2007 | Scheven |
| 7,532,007 B2 | 5/2009 | Song |
| 8,471,599 B2 | 6/2013 | Lee et al. |
| 8,720,552 B2 | 5/2014 | Ayan et al. |
| 8,794,318 B2 | 8/2014 | Harrigan et al. |
| 9,051,822 B2 | 6/2015 | Ayan et al. |
| 2002/0036503 A1 | 3/2002 | Toufaily et al. |
| 2003/0020473 A1 | 1/2003 | Speier et al. |
| 2004/0056658 A1 | 3/2004 | Masak et al. |
| 2004/0090230 A1* | 5/2004 | Appel ............... G01V 3/32 324/307 |
| 2005/0030021 A1 | 2/2005 | Prammer |
| 2008/0136410 A1* | 6/2008 | Song ............... G01V 3/32 324/303 |
| 2008/0174313 A1 | 7/2008 | Ganesan |
| 2009/0072825 A1 | 3/2009 | Prammer et al. |
| 2011/0198078 A1 | 8/2011 | Harrigan |
| 2011/0227570 A1 | 9/2011 | Anand et al. |
| 2011/0284227 A1 | 11/2011 | Ayan |
| 2012/0049844 A1* | 3/2012 | Leveridge ............ G01V 3/32 324/303 |
| 2013/0073206 A1 | 3/2013 | Hou et al. |
| 2013/0081803 A1 | 4/2013 | Tao et al. |
| 2013/0093422 A1 | 4/2013 | Morys et al. |
| 2014/0145716 A1 | 5/2014 | Dirksen et al. |
| 2015/0054503 A1 | 2/2015 | Chen et al. |
| 2015/0061665 A1 | 3/2015 | Reiderman et al. |
| 2015/0192011 A1 | 7/2015 | Mandal et al. |
| 2015/0212225 A1 | 7/2015 | Reiderman |
| 2016/0033670 A1 | 2/2016 | Reiderman |

FOREIGN PATENT DOCUMENTS

| | | |
|---|---|---|
| WO | WO2010085533 A3 | 10/2010 |
| WO | WO2015088551 A1 | 6/2015 |
| WO | WO2015072985 A1 | 11/2015 |

\* cited by examiner

NUCLEAR MAGNETIC RESONANCE SENSING AND FLUID SAMPLING DEVICE FOR SUBTERRANEAN CHARACTERIZATION

BACKGROUND

Various types of formation and fluid evaluations are performed on oil and gas well before and during production operations. One type of formation evaluation operation involves the collection of formation fluid samples for analysis of their hydrocarbon content, estimation of the formation permeability and directional uniformity, determination of the formation fluid pressure, and many others. Measurements of such parameters of the geological formation are typically performed using many devices including downhole formation testing tools that extract fluid from the formation.

Another type of formation evaluation includes nuclear magnetic resonance (NMR) logging. NMR logging, a subcategory of electromagnetic logging, measures the induced magnet moment of hydrogen nuclei (protons) contained within the fluid-filled pore space of a formation. NMR can be used to measure the volume, composition, viscosity, and distribution of these fluids, for example. NMR logging is typically performed by specialized NMR logging tools.

Performing fluid sampling and NMR logging typically requires different specialized tools. Thus, in order to perform these operations, multiple run in hole operations may be needed, and/or a wireline tool may have multiple sections and parts.

BRIEF DESCRIPTION OF THE DRAWINGS

For a detailed description of the embodiments of the invention, reference will now be made to the accompanying drawings in which.

DETAILED DESCRIPTION

Figure 1A:
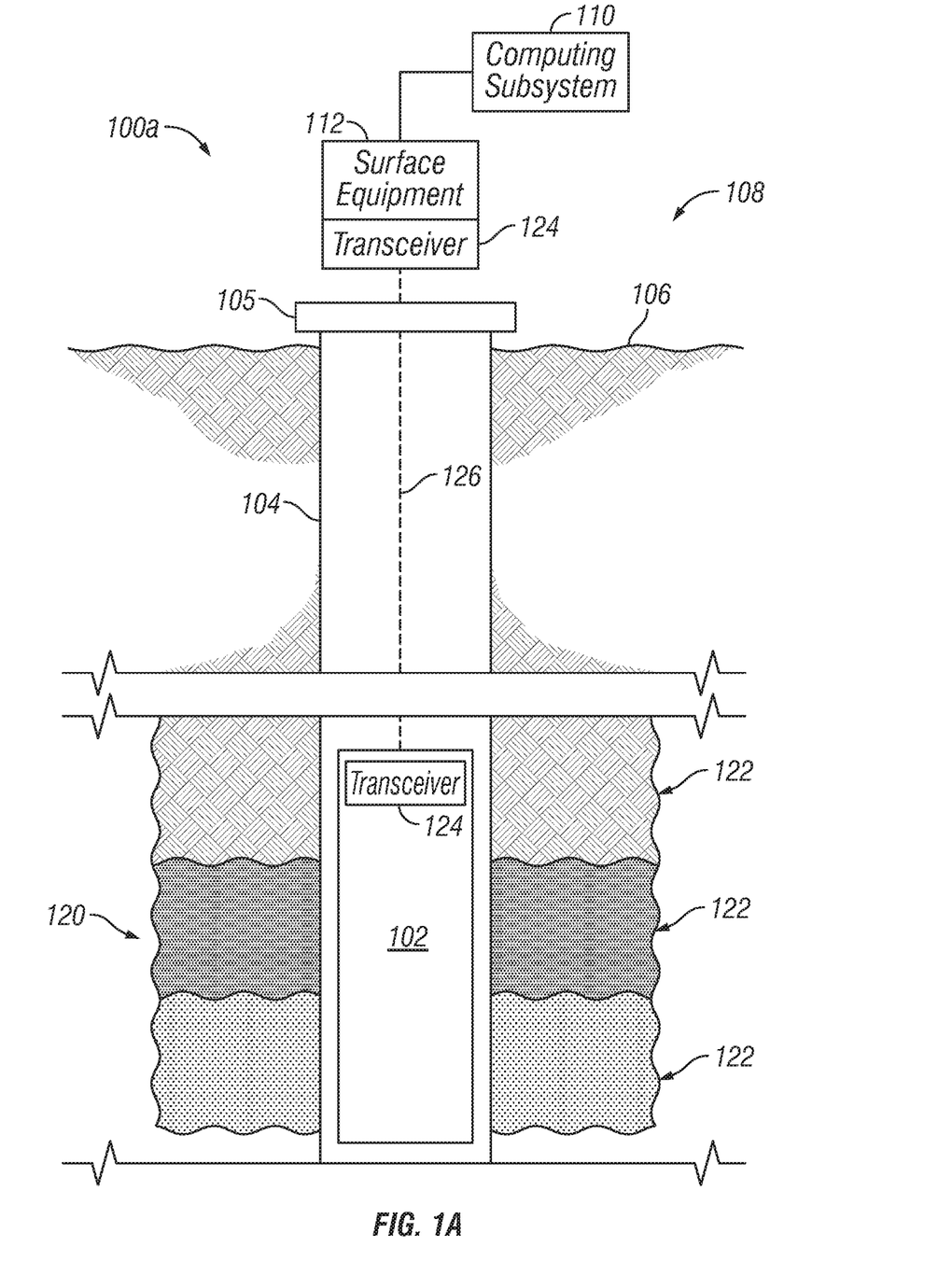
FIG. 1A is a schematic elevation view of an example NMR logging and fluid sampling operation in a well system, in accordance with example embodiments.

FIG. 1A is a schematically-drawn elevation of an example NMR logging operation 100a. The example NMR logging operation 100a utilizes an NMR logging and fluid sampling system 108 in a subterranean region 120 beneath the ground surface 106. An NMR logging operation can include additional or different features that are not shown in FIG. 1A. For example, the NMR logging operation 100a may include additional drilling system components, wireline logging system components, etc.

The subterranean region 120 can include all or part of one or more subterranean formations or zones. The example subterranean region 120 shown in FIG. 1A includes multiple subsurface layers 122 and a wellbore 104 penetrated through the subsurface layers 122. The subsurface layers 122 can include sedimentary layers, rock layers, sand layers, or combinations of these and other types of subsurface layers. One or more of the subsurface layers can contain fluids, such as brine, oil, gas, etc. Although the example wellbore 104 shown in FIG. 1A is a vertical wellbore, the NMR logging and fluid sampling system 108 can be implemented in other wellbore orientations. For example, the NMR logging and fluid sampling system 108 may be adapted for horizontal wellbores, slant wellbores, curved wellbores, vertical wellbores, or combinations of these.

The example NMR logging and fluid sampling system 108 includes an NMR logging and sampling tool 102, surface equipment 112, and a computing subsystem 110 configured to control various aspects of the logging tool 102 and/or receive data therefrom. In the example shown in FIG. 1A, the NMR logging and sampling tool 102 is a downhole logging tool that operates while disposed in the wellbore 104. The example surface equipment 112 shown in FIG. 1A operates at or above the surface 106, for example, near the well head 105, to control the logging and sampling tool 102 and possibly other downhole equipment or other components of the well system 100. The example computing subsystem 110 can receive and analyze logging data from the NMR logging and sampling tool 102, as well as fluid sampling data. An NMR logging system can include additional or different features, and the features of an NMR logging system can be arranged and operated as represented in FIG. 1A or in another manner.

In one or more instances, all or part of the computing subsystem 110 can be implemented as a component of, or can be integrated with one or more components of, the surface equipment 112, the NMR logging and sampling tool 102, or both. In one or more cases, the computing subsystem 110 can be implemented as one or more computing structures separate from the surface equipment 112 and the logging and sampling tool 102.

In one or more implementations, the computing subsystem 110 is embedded in the NMR logging and sampling tool 102, and the computing subsystem 110 and the logging and sampling tool 102 can operate concurrently while disposed in the wellbore 104. For example, although the computing subsystem 110 is shown above the surface 106 in the example shown in FIG. 1A, all or part of the computing subsystem 110 may reside below the surface 106, for example, at or near the location of the logging and sampling tool 102.

The NMR logging system 108 can include communication or telemetry equipment that allow communication among the computing subsystem 110, the logging and sampling tool 102, and other components of the NMR logging and fluid sampling system 108. For example, the logging tool 102 and surface equipment 112 can each include one or more transceivers 124 or similar apparatus for wired or wireless data communication among the various components. The NMR logging and fluid sampling system 108 can include a communication channel 126 such as systems and apparatus for wireline telemetry, wired pipe telemetry, mud pulse telemetry, acoustic telemetry, electromagnetic telemetry, or a combination of these and other types of telemetry. In one or more cases, the logging and sampling tool 102 receives commands, status signals, or other types of information from the computing subsystem 110 or another source via the transceivers 124 and communication channel 126. In one or more cases, the computing subsystem 110 receives logging data, status signals, or other types of information from the logging and sampling tool 102 or another source.

NMR logging and/or fluid sampling operations can be performed in connection with various types of downhole operations at various stages in the lifetime of a well system. Structural attributes and components of the surface equipment 112 and logging tool 102 can be adapted for various types of NMR logging and/or fluid sampling operations. For example, NMR logging and/or fluid sampling may be performed during drilling operations, during wireline logging operations, or in other contexts. As such, the surface equipment 112 and the sampling tool 102 may include, or may operate in connection with drilling equipment, wireline logging equipment, or other equipment for other types of operations.

Figure 1B:
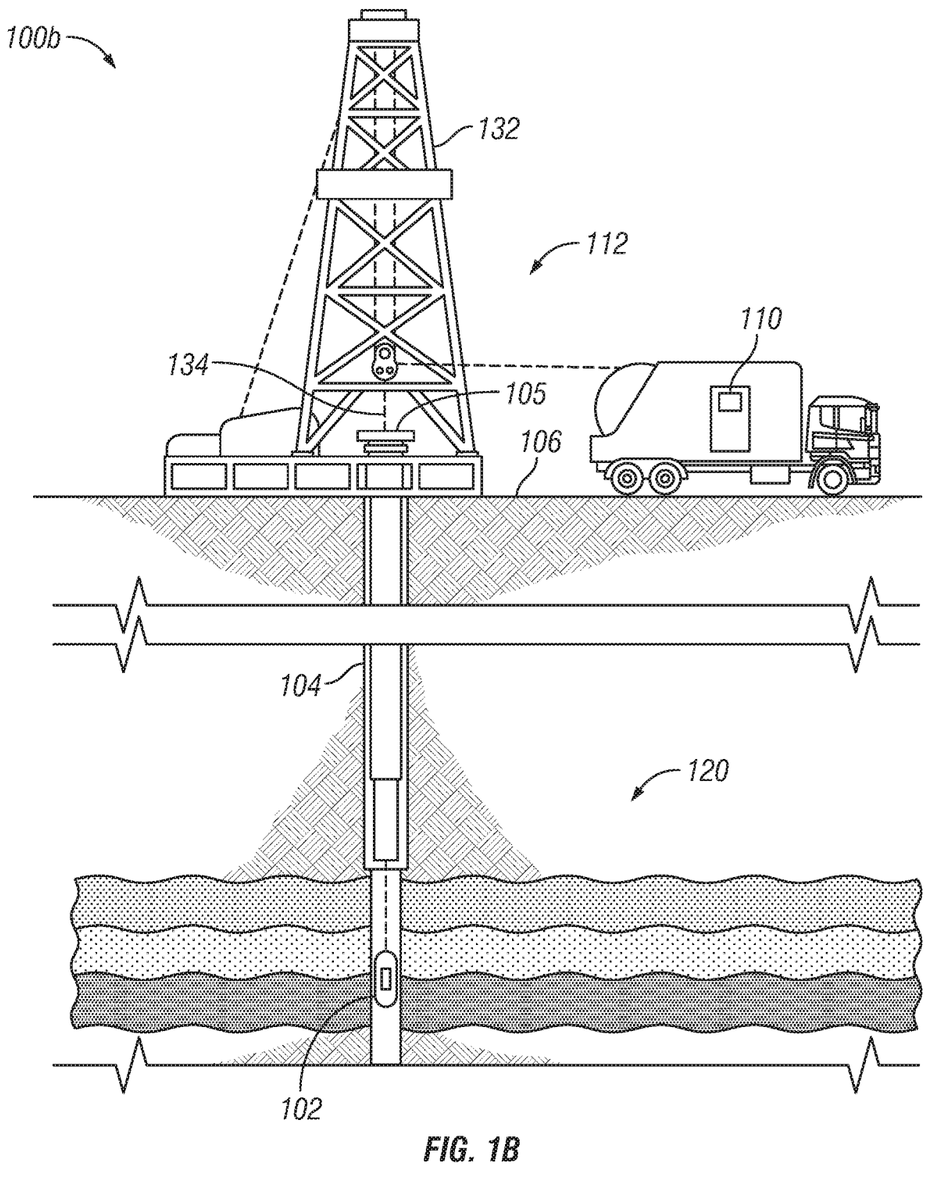
FIG. 1B is a schematic elevation view of a wireline NMR logging and fluid sampling system deployed in a well, in accordance with example embodiments.

In one or more examples, NMR logging and/or fluid sampling operations are performed during wireline logging operations. FIG. 1B shows an example well system 100b that includes the NMR logging and sampling tool 102 in a wireline logging environment. In one or more example wireline logging operations, the surface equipment 112 includes a platform above the surface 106 equipped with a derrick 132 that supports a wireline cable 134 that extends into the wellbore 104. Wireline logging operations can be performed, for example, after a drill string is removed from the wellbore 104, to allow the wireline logging and sampling tool 102 to be lowered by wireline or logging cable into the wellbore 104. The wireline cable 134 may contain conductors for carrying power to the various components of the tool 102 and conductors or cables, such as coaxial or fiber optic cables, for providing two-way data communication between the tool 102 and the computing subsystem 110.

Figure 1C:
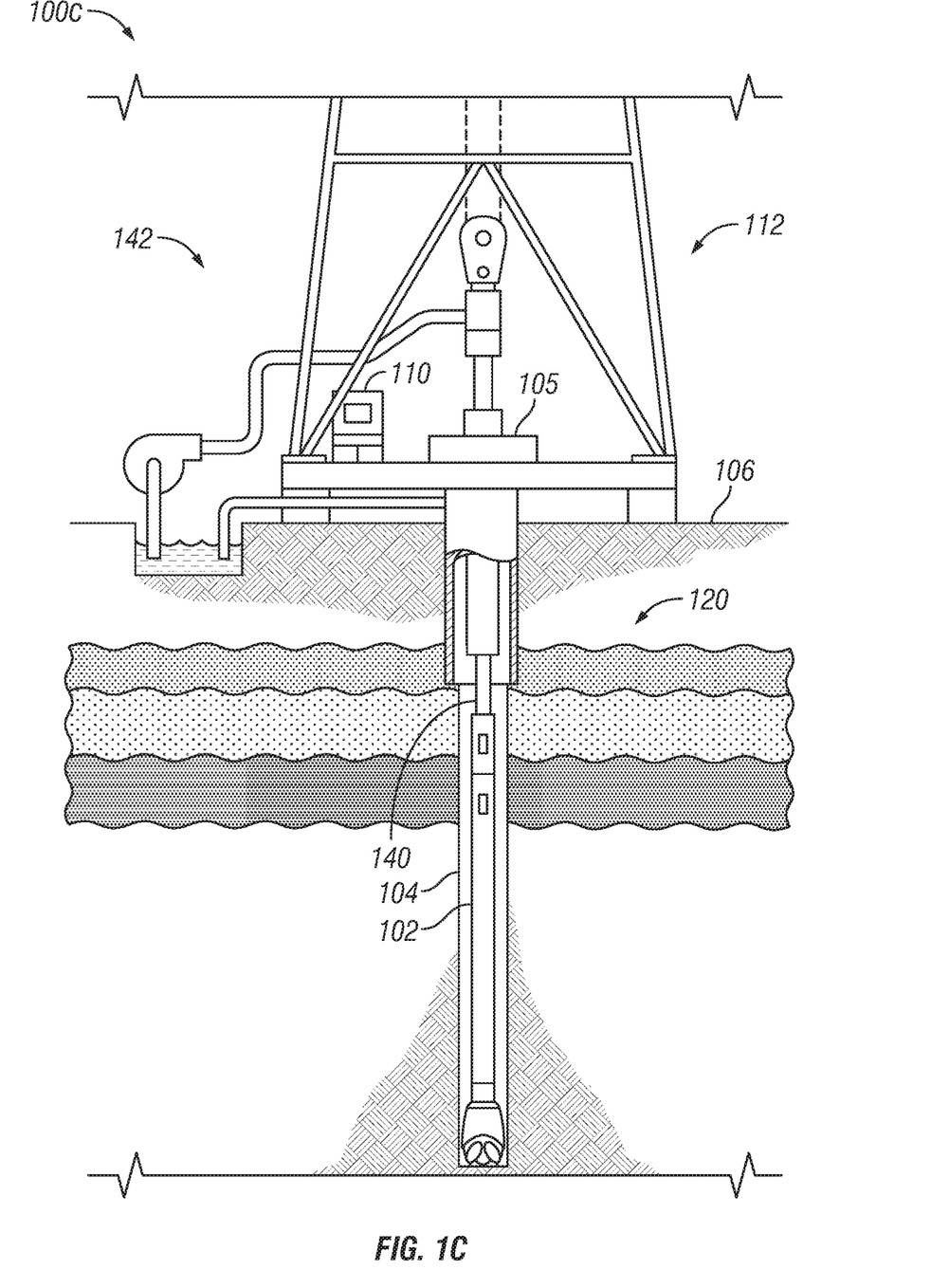
FIG. 1C is a schematic diagram of an NMR logging and fluid sampling system in a logging while drilling (LWD) environment, in accordance with example embodiments.

In one or more examples, NMR logging and/or sampling operations are performed during drilling operations. FIG. 1C shows an example well system 100c that includes the NMR logging and sampling tool 102 in a logging while drilling (LWD) environment. Drilling is commonly carried out using a string of drill pipes connected together to form a drill string 140 that is lowered through a rotary table into the wellbore 104. In one or more cases, a drilling rig 142 at the surface 106 supports the drill string 140, as the drill string 140 is operated to drill a wellbore penetrating the subterranean region 120. The drill string 140 may include, for example, drill pipe, a bottom hole assembly, and other components. The bottom hole assembly on the drill string may include drill collars, drill bits, the NMR logging and sampling tool 102, and other components. The logging and sampling tools may include measuring while drilling (MWD) tools, LWD tools, and the like.

As shown in FIG. 1B, the NMR logging and sampling tool 102 can be suspended in the wellbore 104 by a coiled tubing, wireline cable, or another structure that connects the tool to a surface control unit or other components of the surface equipment 112. In one or more example implementations, the NMR logging and sampling tool 102 is lowered to the bottom of a region of interest and subsequently pulled upward (e.g., at a substantially constant speed) through the region of interest. As shown, for example, in FIG. 1C, the logging tool 102 can be deployed in the wellbore 104 on jointed drill pipe, hard wired drill pipe, or other deployment hardware. In one or more example implementations, the logging and sampling tool 102 collects data during drilling operations as it moves downward through the region of interest. In one or more example implementations, the NMR logging and sampling tool 102 collects data while the drill string 140 is moving, for example, while it is being tripped in or tripped out of the wellbore 104.

In one or more implementations, the logging and sampling tool 102 is configured to both take NMR measurements of a region of interest in the neighboring formation as well as extract fluid samples from the same of another region in the formation.

With respect to NMR logging, the tool 102 may collect data at discrete logging points in the wellbore 104. For example, the logging tool 102 can move upward or downward incrementally to each logging point at a series of depths in the wellbore 104. At each logging point, instruments in the logging tool 102 perform measurements on the subterranean region 120. The measurement data can be communicated to the computing subsystem 110 for storage, processing, and analysis. Such data may be gathered and analyzed during drilling operations (e.g., during logging while drilling (LWD) operations), during wireline logging operations, or during other types of activities.

The computing subsystem 110 can receive and analyze the measurement data from the tool 102 to detect properties of various subsurface layers 122. For example, the computing subsystem 110 can identify the density, material content, or other properties of the subsurface layers 122 based on the NMR measurements acquired by the tool 102 in the wellbore 104.

In one or more implementations, the tool 102 obtains NMR signals by polarizing nuclear spins in the formation 120 and pulsing the nuclei with a radio frequency (RF) magnetic field. Various pulse sequences (i.e., series of radio frequency pulses, delays, and other operations) can be used to obtain NMR signals, including the Carr Purcell Meiboom Gill (CPMG) sequence (in which the spins are first tipped using a tipping pulse followed by a series of refocusing pulses), the Optimized Refocusing Pulse Sequence (ORPS) in which the refocusing pulses are less than 180°, a saturation recovery pulse sequence, and other pulse sequences.

Figure 2:
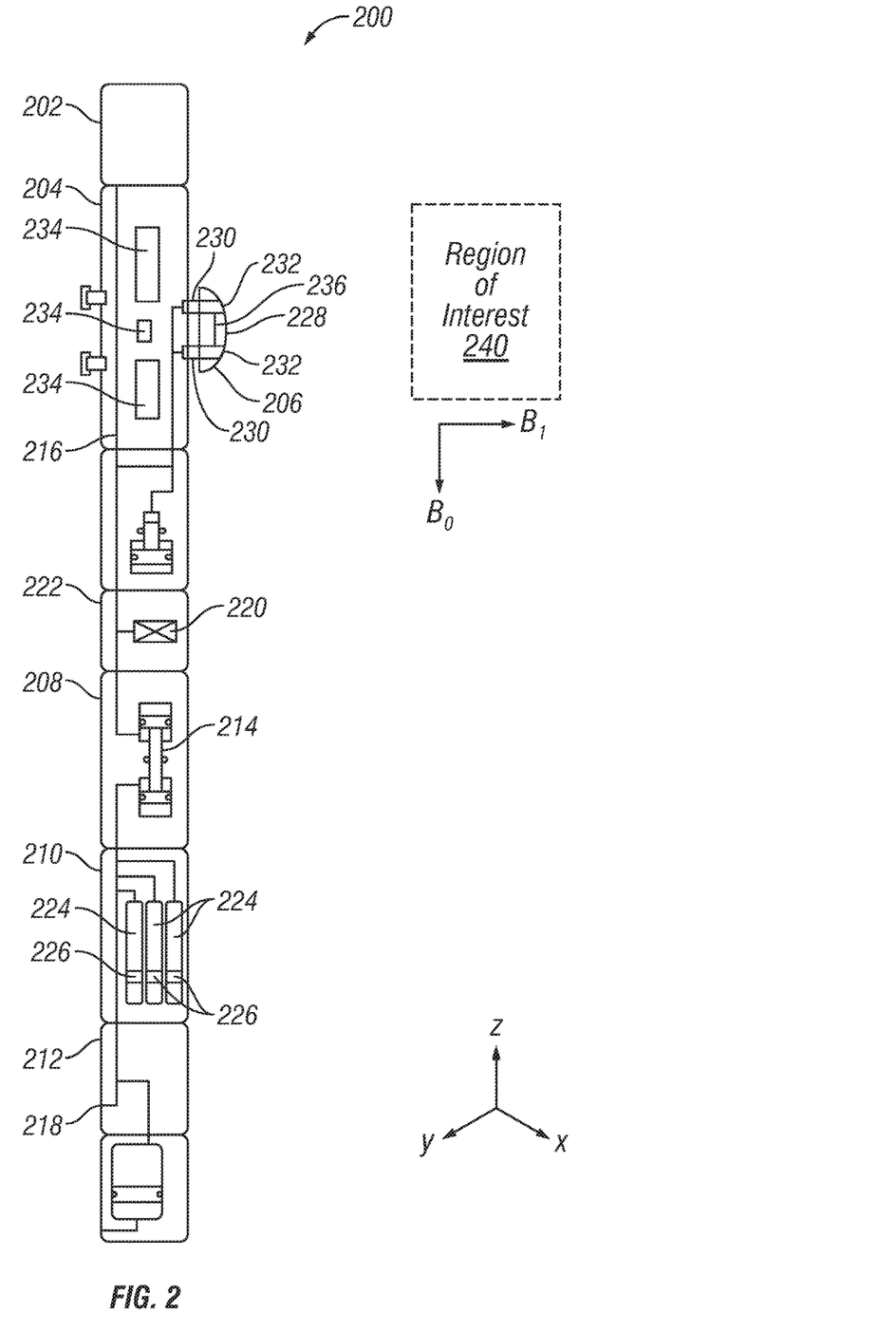
FIG. 2 is a schematic diagram of an NMR logging and fluid sampling device, in accordance with example embodiments.

FIG. 2 depicts a diagrammatical representation of an NMR logging and fluid sampling tool 200, in accordance with example embodiments. The tool 200 comprises a hydraulic power module 202 configured to convert electrical power into hydraulic power, an NMR module 204 configured to enable NMR measurements, a probe 206 configured to take samples of the formation fluids, a flow control module 208 configured to regulate the flow of various fluids in and out of the tool 200, a fluid test module 222 for performing different tests on a fluid sample, a multi-chamber sample collection module 210 that may contain various size chambers for storage of the collected fluid samples, and a telemetry module 212 that provides electrical and data communication between the modules and the uphole computing subsystem 110. The telemetry module 212 may also condition received power for use by the other modules. The arrangement of the various modules may depend on the specific application. Other embodiments may include more or fewer modules than those depicted herein, depending on design and application. In particular, telemetry module 212 may provide high-speed data bus from the computing subsystem 110 to the modules or between the modules.

In one or more embodiments, the flow control module 208 includes a double acting piston pump 214, which controls the formation fluid flow from the formation into flow line 216 via the probe 206. Fluid entering the probe 206 flows through the flow line 216 and may enter the fluid testing module 222 and/or be discharged into the wellbore via outlet 218. A fluid control device, such as a control valve, may be connected to flow line 216 for controlling the fluid flow from the flow line 216 into the borehole. Flow line fluids can be preferably pumped either up or down with all of the flow line fluid directed into or though pump 214. Flow control module 208 may further accommodate strain-gauge pressure transducers that measure an inlet and outlet pump pressures.

The fluid testing module 222 of the tool contains a fluid testing device 220, which analyzes the fluid flowing through flow line 216. Any suitable device or devices may be utilized to analyze the fluid for a variety of parameters, such as formation pressure measurements, pressure-volume-temperature (PVT) analysis, among others. In an example embodiment, a quartz gauge carrier can be used. The quartz gauge may include a pressure resonator and temperature compensation and reference crystals packaged as a single unit with each adjacent crystal in direct contact. The assembly is contained in an oil bath that is hydraulically coupled with the pressure being measured. The quartz gauge enables measurement of such parameters as the drawdown pressure of fluid being withdrawn and fluid temperature.

Sample collection module 210 of the tool may contain various size chambers 224 for storage of the collected fluid sample. In one or more embodiments, one or more of the chambers 224 may include compartments separated by a valve 226, which selectively permits flow between the compartments. In one or more embodiments, the probe 206 may also inject fluid from the tool 200 into the formation, through which residual oil and water saturation parameters can be obtained.

The probe 206 is extendable from the tool 200 via an extension mechanism 230, such as telescoping arms, scissor extensions, and the like. The probe 206 can be extended outwardly from the tool 200 to contact the borehole wall. The probe 206 may also include a sealing pad 228 configured to provide sealing contact with a surface of the borehole at a desired location. The sealing pad 228 comprises electrical and mechanical components that facilitate testing, sampling and retrieval of fluids from the formation. The probe 206 includes one or more channels 232 through which fluids from the sealed-off part of the formation surface may be collected and brought into the tool 202. The sealing pad 228 may be made of an elastomeric material, such as rubber, compatible with the well fluids and the physical and chemical conditions expected to be encountered in an underground formation. In one or more embodiments, the probe 206 extends from the NMR module 204.

The NMR module 204 includes one or a plurality of magnets 234 located within or on the NMR module 204. The magnets 234 may be located anywhere around or within the tool 200 and separate from the probe 206. In one or more embodiments, the magnets 234 are permanent magnets. The configuration of magnets 234 in the tool 200 illustrated in FIG. 2 is an example configuration, designed to generate a specific magnetic field shape appropriate for a specific application. However, the magnets 234 can be configured in any other orientation, with different polarity orientations, sizes, shapes, positioning. There may also be more or less magnets 234 than illustrated in FIG. 2.

The probe 206 includes an antenna or radio frequency (RF) coil 236 configured to emit NMR signals. The coil 236 may be located on a surface of the probe 206 or embedded within the probe 206. The coil 236 may be a radial coil, a tangential coil, combinations of different coils, or the like. The coil 236 may also include both a radial coil and a tangential coil. The probe 206 may also include more than one coil 236 positioned in any position relative to each other, generating a combined RF field.

During an NMR measurement operation, the tool 200 is brought into a position within the wellbore 104 approximate to a region of interest 240 in the surrounding formation. The magnets 234 are configured to induce a magnetic field, $B_0$, in the region of interest 240. The coil 236 in the measurement device 210 is positioned to generate a radio frequency magnetic field ($B_1$) in the region of interest 240 220. In one or more embodiments, $B_0$ and $B_1$ are substantially orthogonal in the region of interest 240. In one or more embodiments, the measurement device 210 may also include strategically placed soft magnetic material, which is a material that is easily magnetized and demagnetized to further shape the $B_0$ field to the desired shape. The combined $B_0$ and $B_1$ field cause polarizing nuclear spins in the formation, which, in one or more embodiments, is sensed by the RF coil 236, constituting NMR logging data. In one or more other embodiments, the nuclear spins or NMR logging data are sensed by a second RF coil or antenna. In one or more embodiments, the probe 206 may also include soft magnetic material which additionally shapes the static magnetic field, $B_0$.

In one or more embodiments, the RF coil 236 may be driven by the computing subsystem 110, which may also receive and/or process NMR data collected by the RF coil 236. In one or more embodiments, the telemetry module 212 or another controller in the tool is configured to drive the RF coil 236 and communicate the collected data uphole. In one or more embodiments, the RF coil 236 can be driven at various adjustable frequencies based on the desired field and pulse scheme.

In one or more embodiments, the static magnetic field, $B_0$, is substantially in longitudinal direction (or z direction) and the RF magnetic field, $B_1$, produced by the radial RF coil 236 is substantially transversal and perpendicular to the direction of the static magnetic field, $B_0$, at the region of interest 240. The shapes of the static magnetic field, $B_0$, and the RF magnetic field, $B_1$, are determined at least in part by the configuration of magnets 234, configuration of the coil 236, and the driving scheme of the coil 236.

Figure 3:
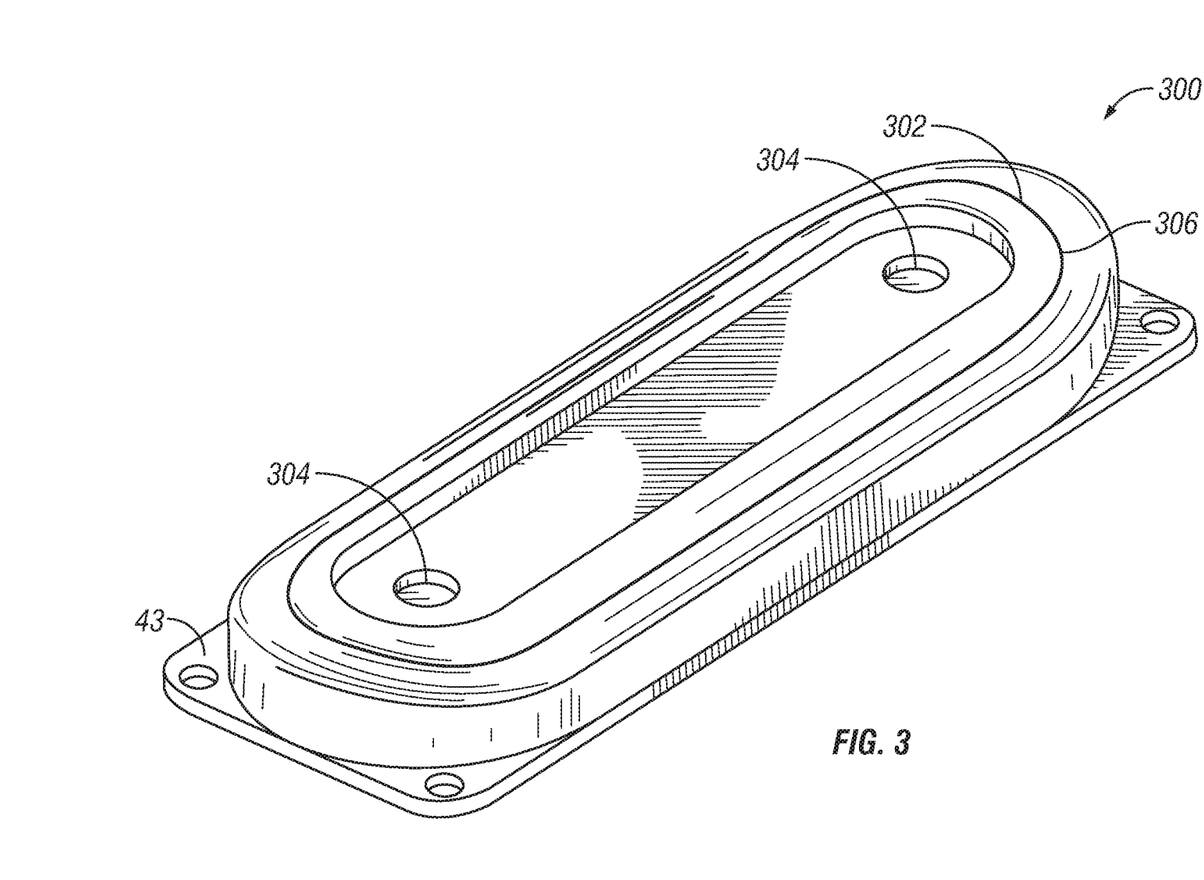
FIG. 3 is perspective view a probe of the NMR logging and fluid sampling system, in accordance with example embodiments.

FIG. 3 depicts a perspective view of a probe 300 such as probe 206 of FIG. 2, in accordance with one or more embodiments. The probe 300 includes a pad 302 configured to seal against a wellbore surface and ports 304 configured to receive fluid from the formation. An RF antenna or coil 306 may be located on the surface of the pad 302. Alternatively, the coil 306 may be embedded within the pad 302.

The NMR logging and fluid sampling tool 200 can be used for several novel applications. For example, the NMR measurement capabilities of the tool 200 can be used to monitor the draw-down process. NMR measurements can also be used to discriminate between multiple fluid phases, which allows for analysis of time-dependent multiphase flow. In one or more embodiments, relative permeability of the formation as a function of saturation can be obtained by taking NMR measurements as fluid is injected into or drawn from the formation.

In addition to the embodiments described above, many examples of specific combinations are within the scope of the disclosure, some of which are detailed below:

Example 1

A subterranean characterization and fluid sampling device for analyzing a fluid from a subterranean formation, comprising:
a controller;
a tool body including a fluid testing module configured to receive a sample of the fluid from the subterranean formation and a permanent magnet generating a static magnetic field ($B_0$); and a probing module coupled to the tool body and separate from the permanent magnet, and configured to withdraw the fluid from the formation and deliver the fluid to the testing module, wherein the probing module includes an antenna, wherein the antenna is electrically coupled to the controller and generates a radio frequency magnetic field ($B_1$) in response to a signal from the controller.

Example 2

The device of claim 1, wherein the probing module comprises a sealing pad configured to seal against the formation.

Example 3

The device of claim 2, wherein the antenna is embedded within the sealing pad.

Example 4

The device of claim 1, wherein the probing module comprises a soft magnetic material.

Example 5

The device of claim 1, wherein $B_0$ is substantially orthogonal to $B_1$ in a region of interest.

Example 6

The device of claim 1, wherein the probing module is outwardly extendable from the tool body.

Example 7

The device of claim 1, wherein the permanent magnet is located within the tool body.

Example 8

A subterranean characterization and fluid sampling device for analyzing a fluid from a subterranean formation, comprising:
a tool body including a fluid testing module configured to receive a sample of the fluid from the subterranean formation and a permanent magnet inducing a static magnetic field ($B_0$);
a probing module extendable from the tool body and configured to inject fluid into or withdraw fluid from the formation and comprising an antenna controllable to generate a radio frequency magnetic field ($B_1$), receive an NMR response signal, or both; and
a controller communicatively coupled to the antenna and controllable to drive the antenna, process the NMR response signal, or both.

Example 9

The device of claim 8, wherein the probing module comprises a soft magnetic material.

Example 10

The device of claim 8, wherein $B_0$ is substantially orthogonal to $B_1$ in a region of interest.

Example 11

The device of claim 8, wherein the probing module is outwardly extendable from the tool body.

Example 12

The device of claim 8, wherein a fluid sample from the formation is deliverable to the fluid testing module via the probing module.

Example 13

The device of claim 8, wherein the fluid testing module is configured to perform one or more types of fluid analysis on the fluid sample.

Example 14

The device of claim 8, wherein the antenna is driven at an adjustable frequency and pulse scheme.

Example 15

A method of subterranean characterization by analyzing a fluid sample from a subterranean formation, comprising:
generating a magnetic field ($B_0$) via a permanent magnet coupled to a tool body of a nuclear magnetic resonance (NMR) device;
generating a radio frequency magnetic field ($B_1$) via a first antenna located in a probing module of the NMR device;
receiving an NMR response signal via the antenna or a second antenna; and
withdrawing a sample of the fluid from or injecting fluid into the formation via the probing module.

Example 16

The method of claim 16, further comprising measuring permeability of the formation via the NMR response signal.

Example 17

The method of claim 16, further comprising testing the fluid sample within the tool body.

Example 18

The method of claim 16, further comprising driving the antenna at an adjustable frequency, in pulses, or both.

Example 19

The method of claim 16, further comprising receiving the response signal while withdrawing the fluid sample.

Example 20

The method of claim 16, further comprising receiving the NMR response signal while withdrawing the fluid sample.

This discussion is directed to various embodiments of the invention. The drawing figures are not necessarily to scale. Certain features of the embodiments may be shown exaggerated in scale or in somewhat schematic form and some details of conventional elements may not be shown in the interest of clarity and conciseness. Although one or more of these embodiments may be preferred, the embodiments disclosed should not be interpreted, or otherwise used, as limiting the scope of the disclosure, including the claims. It is to be fully recognized that the different teachings of the embodiments discussed may be employed separately or in any suitable combination to produce desired results. In addition, one skilled in the art will understand that the description has broad application, and the discussion of any embodiment is meant only to be exemplary of that embodiment, and not intended to intimate that the scope of the disclosure, including the claims, is limited to that embodiment.

Certain terms are used throughout the description and claims to refer to particular features or components. As one skilled in the art will appreciate, different persons may refer to the same feature or component by different names. This document does not intend to distinguish between components or features that differ in name but not function, unless specifically stated. In the discussion and in the claims, the terms "including" and "comprising" are used in an open-ended fashion, and thus should be interpreted to mean "including, but not limited to . . . ." Also, the term "couple" or "couples" is intended to mean either an indirect or direct connection. In addition, the terms "axial" and "axially" generally mean along or parallel to a central axis (e.g., central axis of a body or a port), while the terms "radial" and "radially" generally mean perpendicular to the central axis. The use of "top," "bottom," "above," "below," and variations of these terms is made for convenience, but does not require any particular orientation of the components.

Reference throughout this specification to "one embodiment," "an embodiment," or similar language means that a particular feature, structure, or characteristic described in connection with the embodiment may be included in at least one embodiment of the present disclosure. Thus, appearances of the phrases "in one embodiment," "in an embodiment," and similar language throughout this specification may, but do not necessarily, all refer to the same embodiment.

Although the present invention has been described with respect to specific details, it is not intended that such details should be regarded as limitations on the scope of the invention, except to the extent that they are included in the accompanying claims.

What is claimed is:

1. A method of subterranean characterization of a subterranean formation and a subterranean formation fluid by analyzing the fluid in the subterranean formation and a sample of the fluid from the subterranean formation, comprising:

generating a magnetic field ($B_0$) via a permanent magnet in a tool body of a nuclear magnetic resonance (NMR) device;

generating a radio frequency magnetic field ($B_1$) via an antenna located in a probing module of the NMR device separate and extendable from the tool body;

receiving an NMR response signal from the subterranean formation via the antenna; and withdrawing a sample of the fluid from or injecting fluid into the subterranean formation via the probing module.

2. The method of claim 1, further comprising measuring permeability of the subterranean formation via the NMR response signal.

3. The method of claim 1, comprising withdrawing the fluid sample and further comprising testing the fluid sample within the tool body.

4. The method of claim 1, further comprising driving the antenna at an adjustable frequency, in pulses, or both.

5. The method of claim 1, further comprising receiving the NMR response signal while withdrawing the fluid sample.

6. The method of claim 1, further comprising receiving the NMR response signal while injecting the fluid.

* * * * *